United States Patent [19]
Cho et al.

[11] Patent Number: 6,027,971
[45] Date of Patent: Feb. 22, 2000

[54] METHODS OF FORMING MEMORY DEVICES HAVING PROTECTED GATE ELECTRODES

[75] Inventors: Kyung-rae Cho; Keon-soo Kim; Jin-woo Kim, all of Kyungki-do, Rep. of Korea

[73] Assignee: Samsung Electronics Co., Ltd., Rep. of Korea

[21] Appl. No.: 08/895,513

[22] Filed: Jul. 16, 1997

[30] Foreign Application Priority Data

Jul. 16, 1996 [KR] Rep. of Korea ................ 96/28871
May 20, 1997 [KR] Rep. of Korea ................ 97/19561

[51] Int. Cl.[7] ............................................. H01L 21/336
[52] U.S. Cl. ................................................... 438/257
[58] Field of Search ........................... 438/257–267

[56] References Cited

U.S. PATENT DOCUMENTS

| | | | |
|---|---|---|---|
| 5,019,527 | 5/1991 | Ohshima et al. | 437/43 |
| 5,120,671 | 6/1992 | Tang et al. | 437/43 |
| 5,264,718 | 11/1993 | Gill | 257/316 |
| 5,470,773 | 11/1995 | Liu et al. | 437/43 |
| 5,534,455 | 7/1996 | Liu | 437/43 |
| 5,547,884 | 8/1996 | Yamaguchi et al. | 437/43 |
| 5,552,331 | 9/1996 | Hsu et al. | 437/40 |
| 5,568,422 | 10/1996 | Fujiwara | 365/185.33 |
| 5,610,091 | 3/1997 | Cho | 437/43 |
| 5,736,442 | 4/1998 | Mori | 438/257 |

*Primary Examiner*—Joni Chang
*Attorney, Agent, or Firm*—Myers Bigel Sibley & Sajovec

[57] ABSTRACT

Methods of forming memory device having protected gate electrodes include the steps of forming protection layers on gate electrodes, word lines and related structures and then using these protected structures as etching and implantation masks to reliably form semiconductor regions in a substrate. In particular, methods of forming integrated circuit memory devices preferably include the steps of patterning a field oxide isolation region at a face of a semiconductor substrate to define an active region therein and then forming a gate electrode of a memory device on the active region. Word lines are also formed on the gate electrode and on the field oxide isolation region. A first protection layer, comprising a material which can preferably be used as a selective etching mask, is also formed on an upper surface of the word line to protect the word line. The field oxide isolation region, which may be a relatively thick silicon dioxide layer, is then preferably etched to expose the face of the substrate. Here, the etching step is performed using the protected word line as an etching mask.

30 Claims, 19 Drawing Sheets

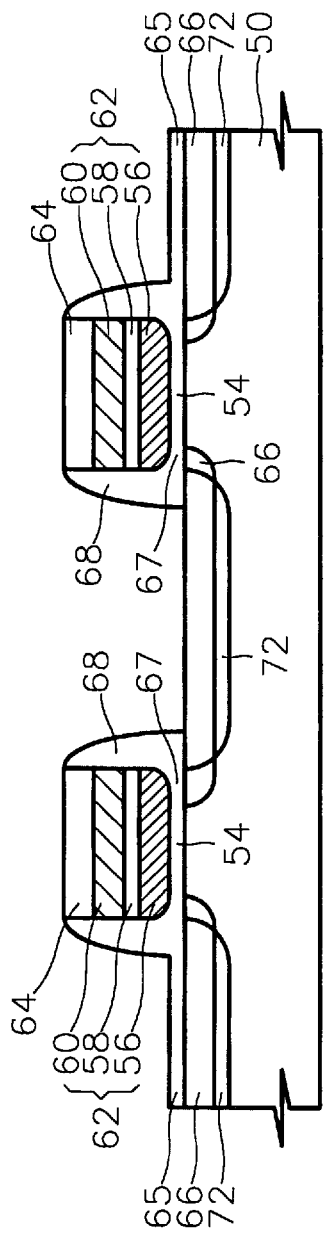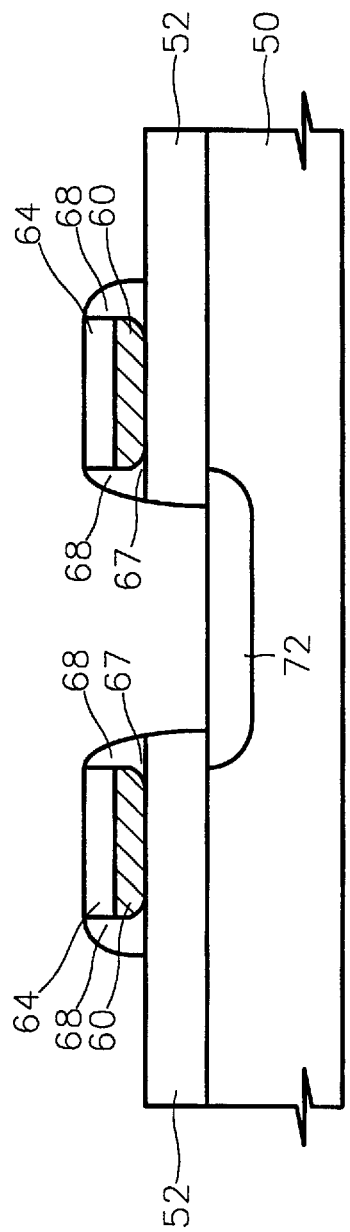

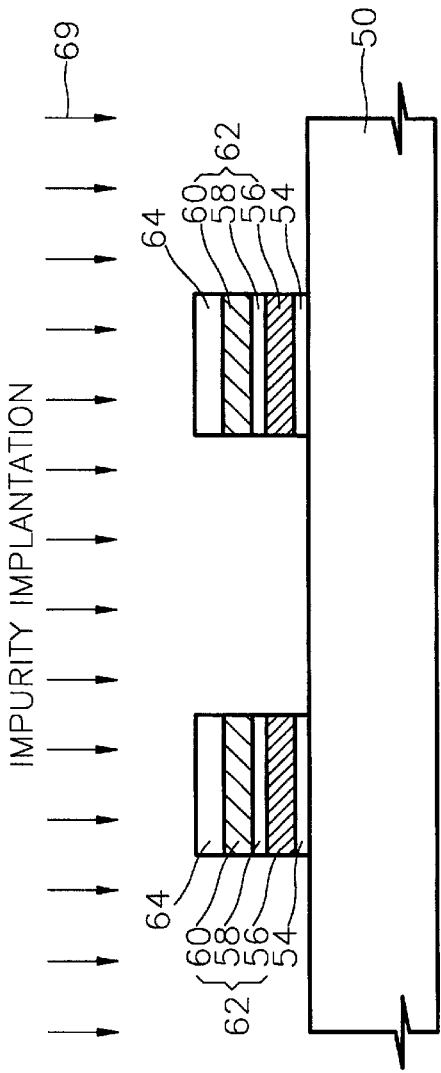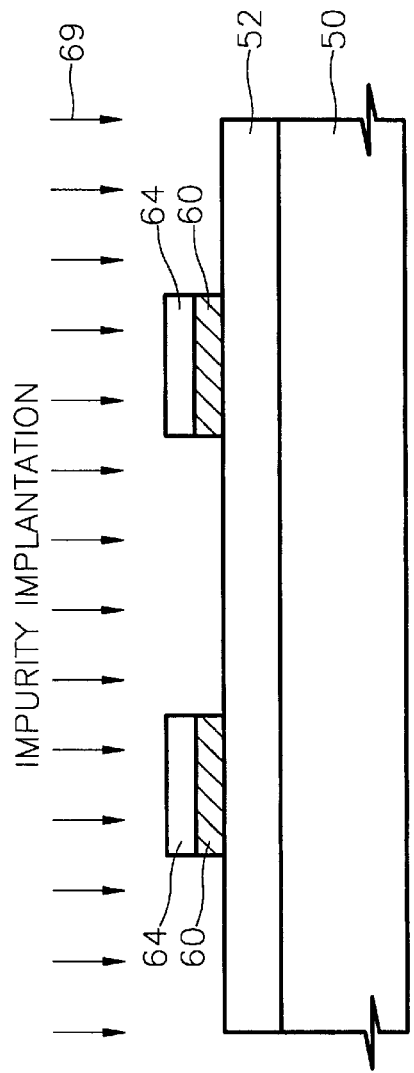

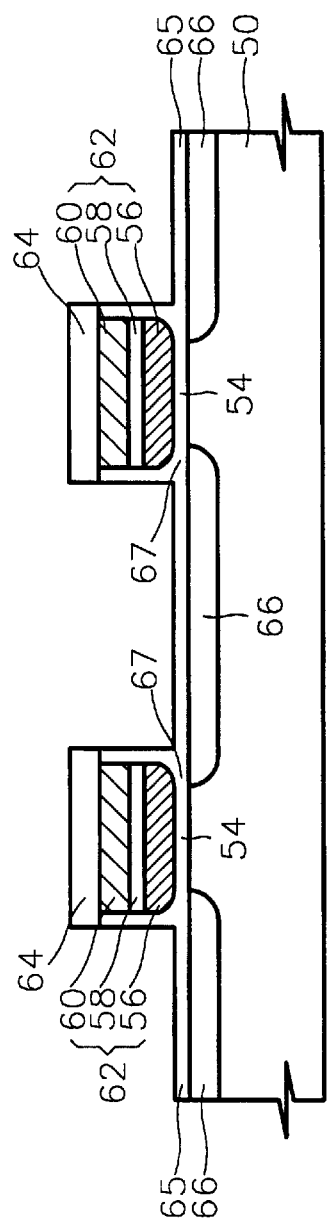
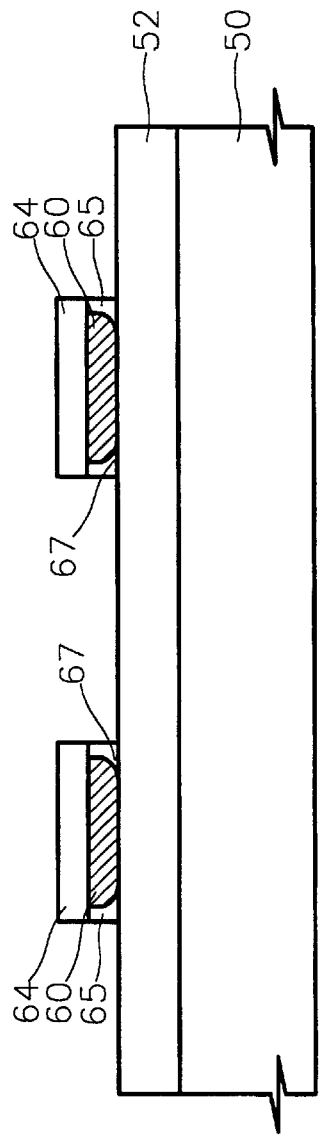

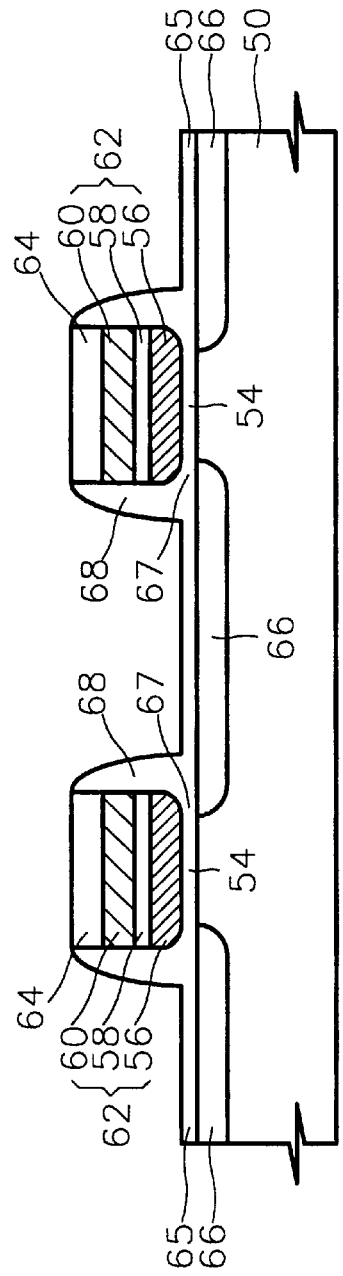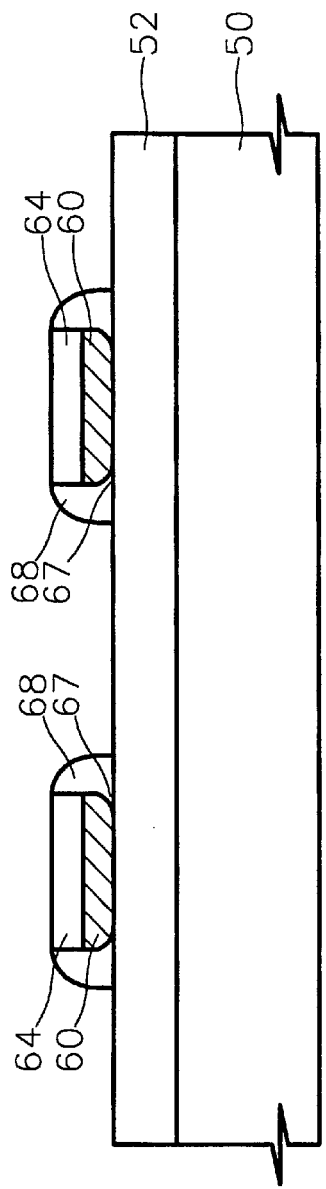

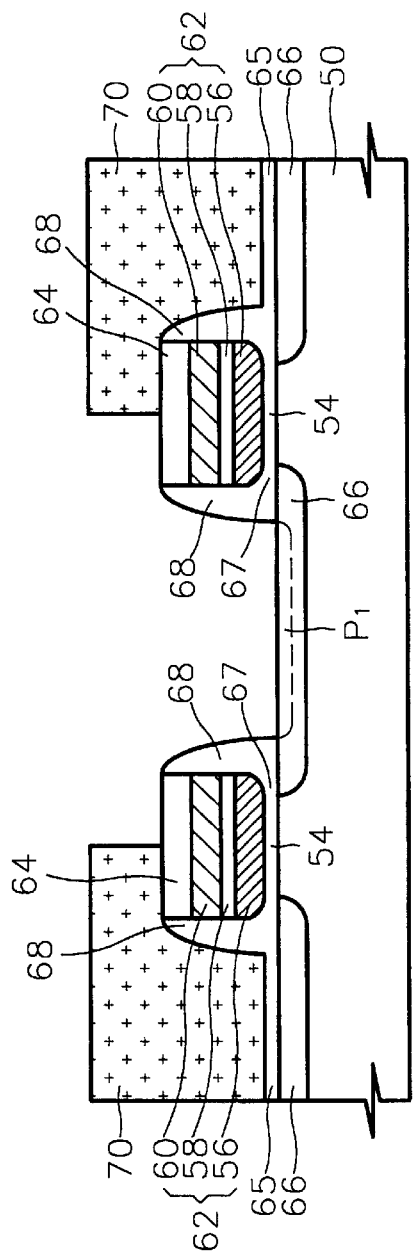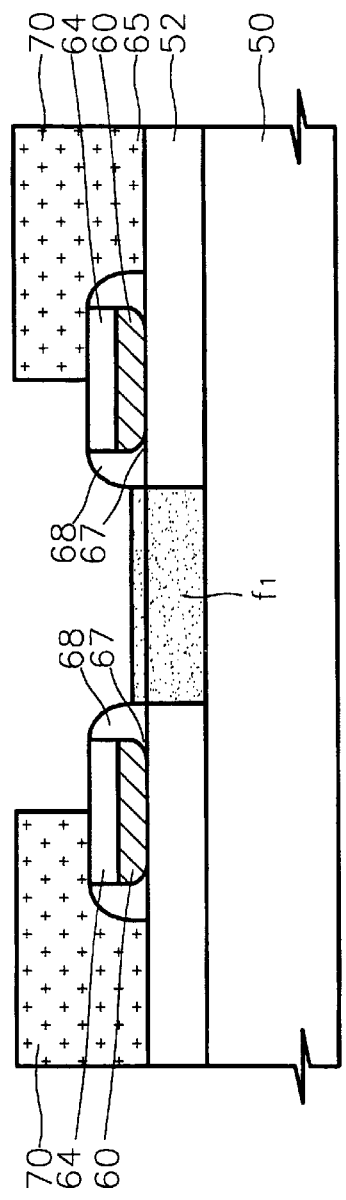

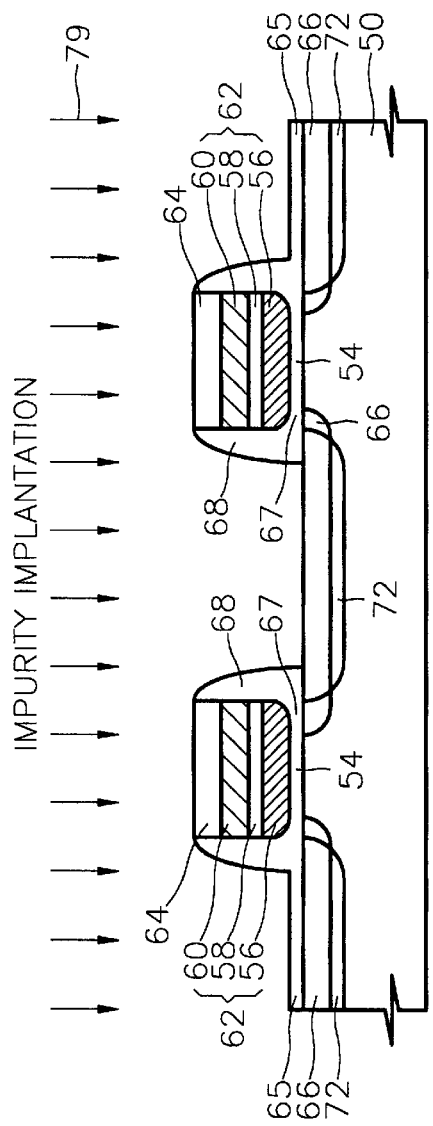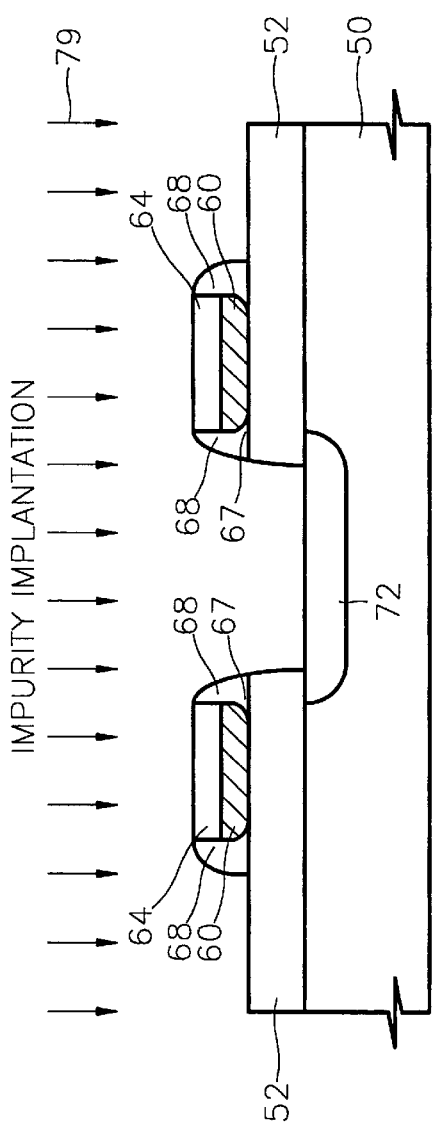

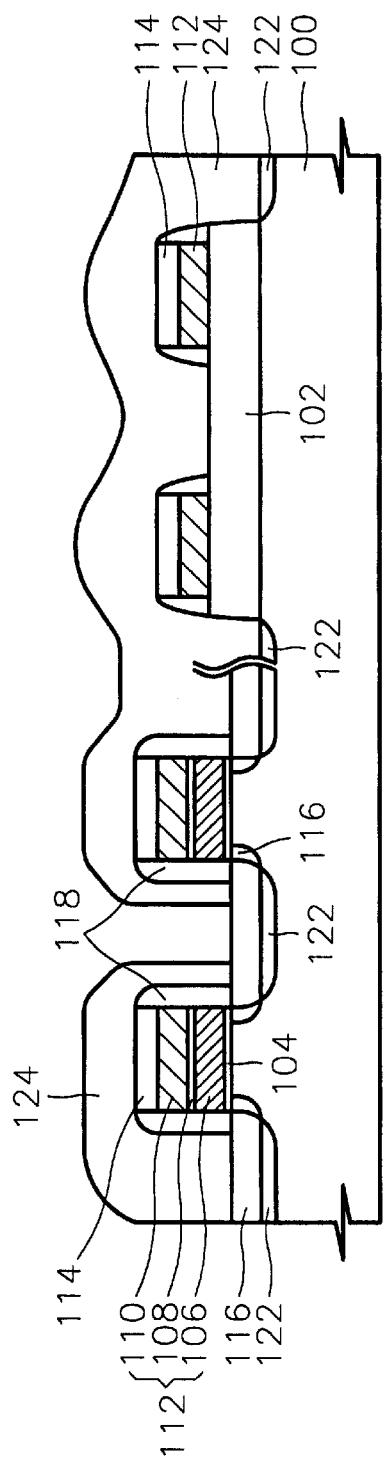
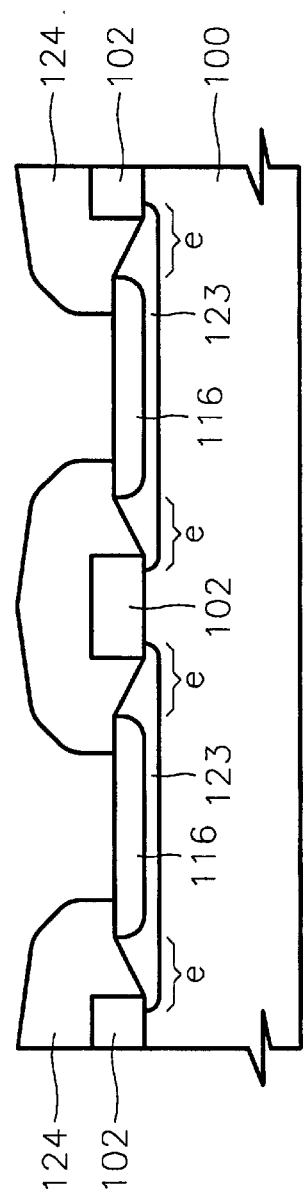

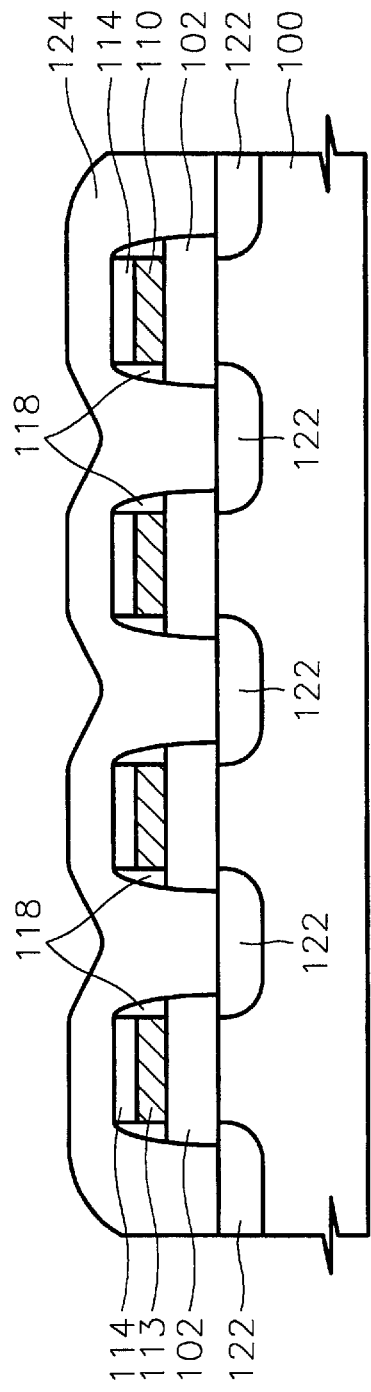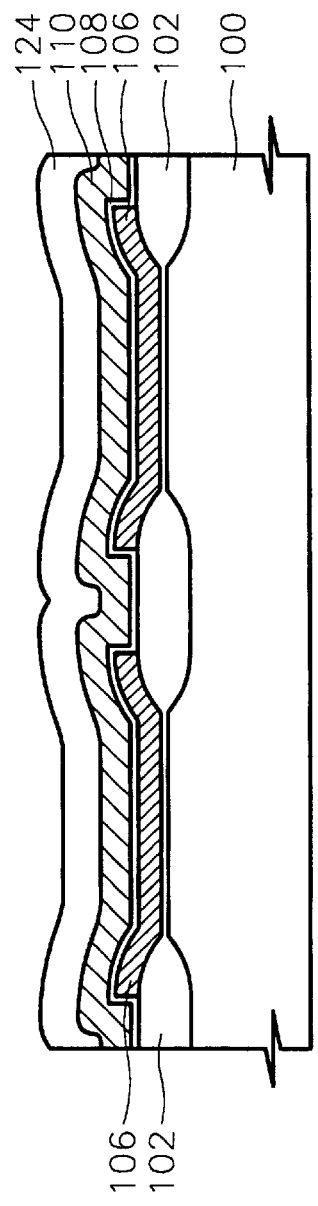

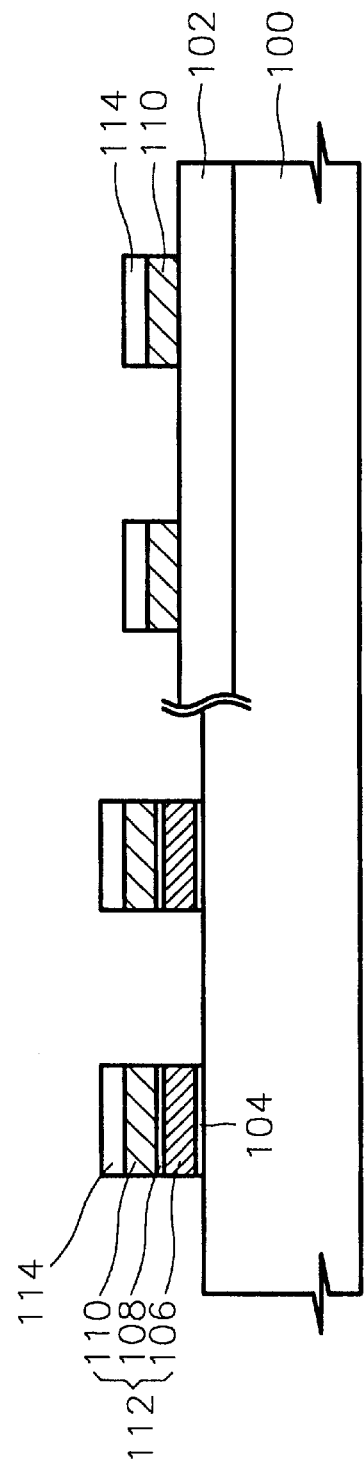
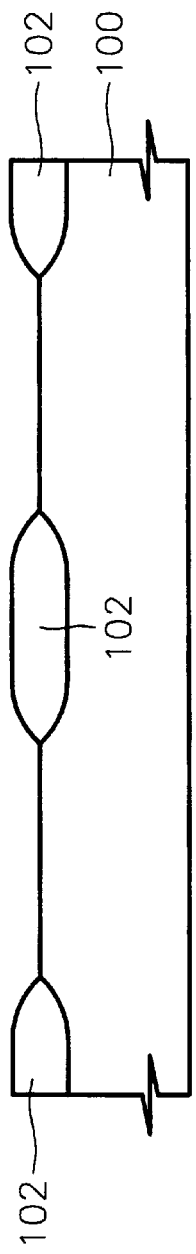

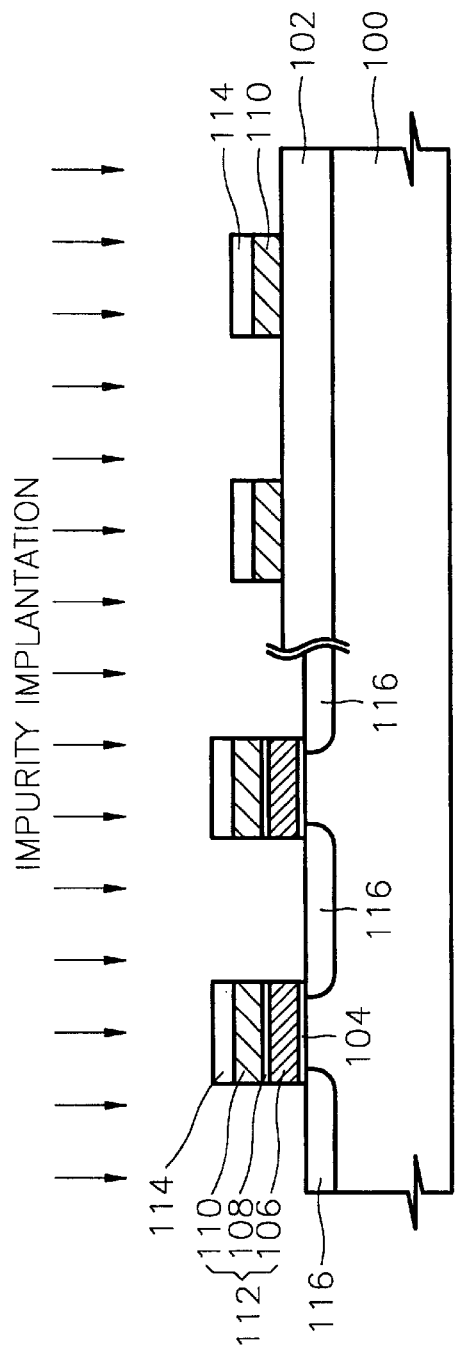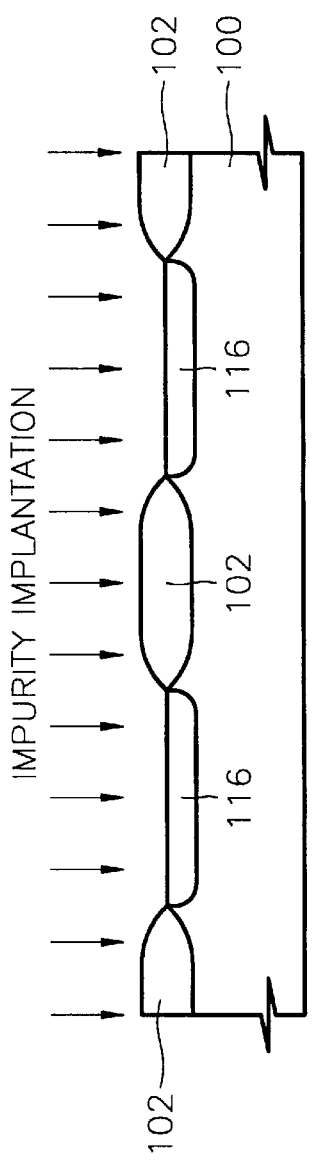

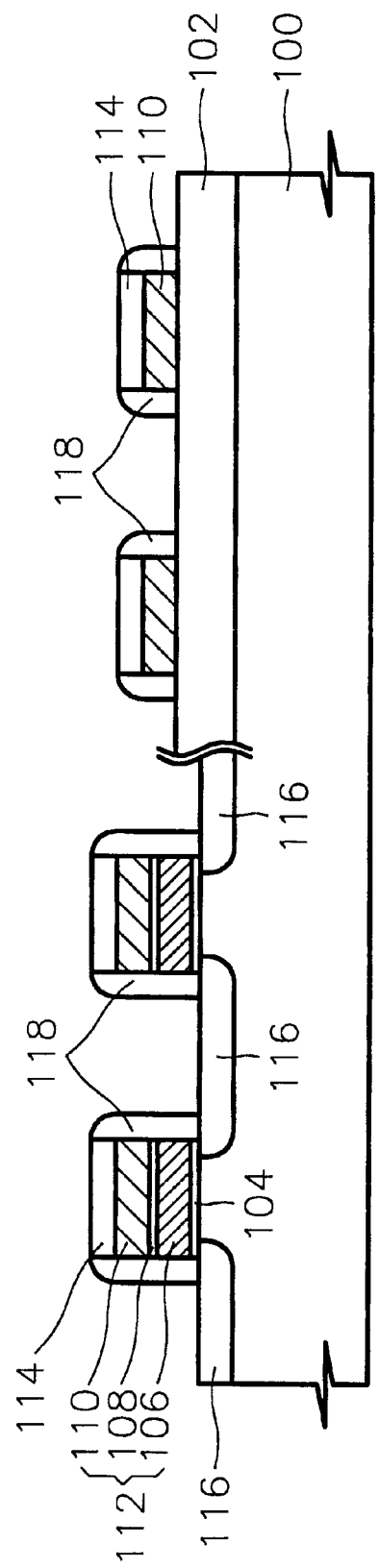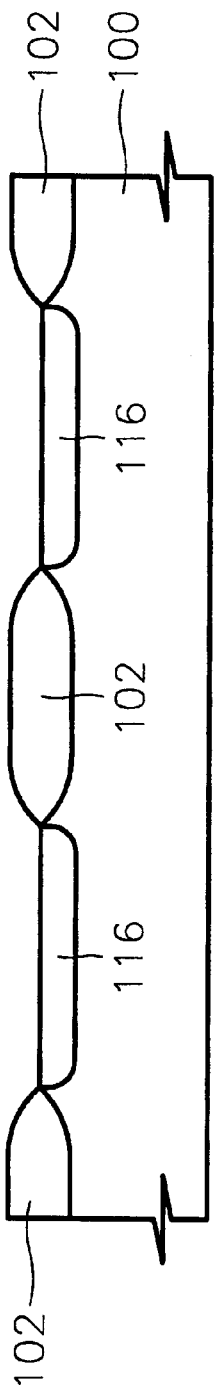
FIG. 15A
FIG. 15B

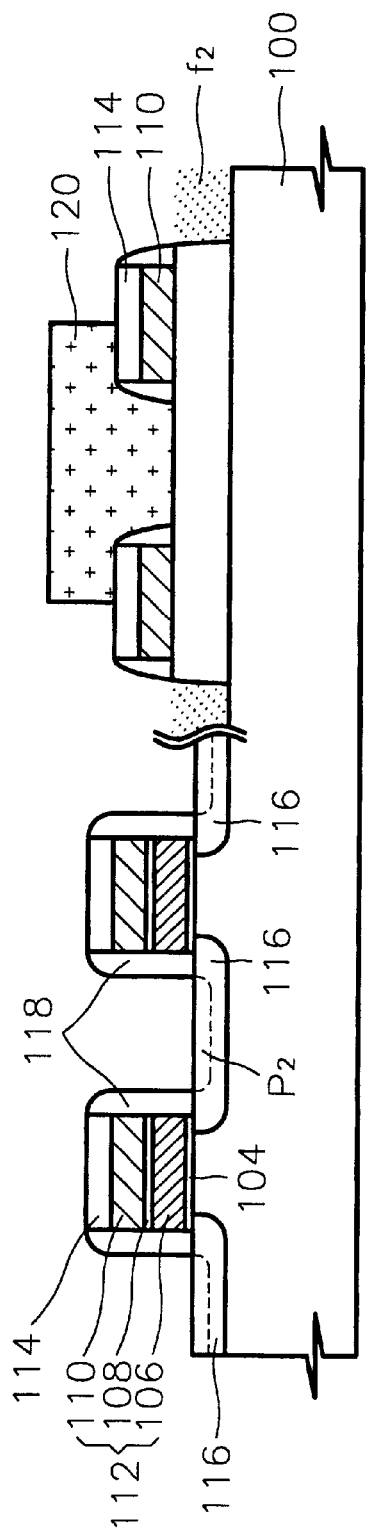
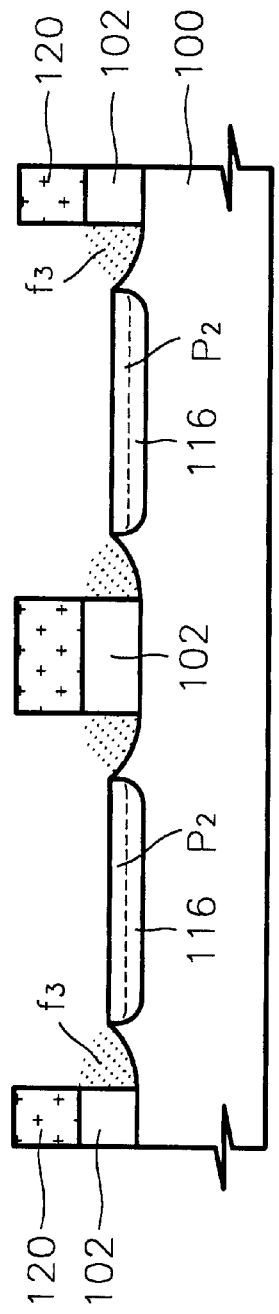

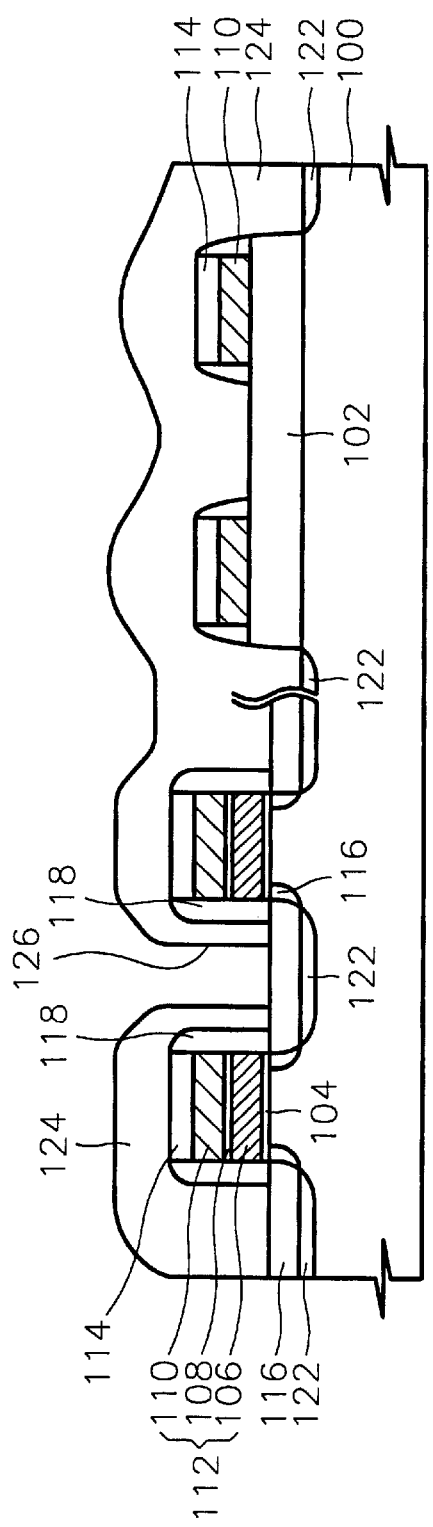

METHODS OF FORMING MEMORY DEVICES HAVING PROTECTED GATE ELECTRODES

FIELD OF THE INVENTION

The present invention relates to methods of forming integrated circuit memory devices and devices formed thereby.

BACKGROUND OF THE INVENTION

In general, in a nonvolatile memory device, a memory cell is comprised of a transistor having a gate comprised of a floating gate and a control gate, a source and a drain. The sources of the respective cells are typically connected in a line. A method of forming memory devices having source regions connected in a line is disclosed in U.S. Pat. No. 5,120,671, entitled "Process for Self Aligning a Source Region with a Field Oxide Region and a Polysilicon Gate." In particular, U.S. Pat. No. 5,120,671 discloses a method for forming a source region self-aligned to a field oxide isolation region and a polysilicon word line. However, according to this method, a cell gate being on an active region and a source region in an active region may be damaged during steps for forming a source line by etching a field oxide layer and performing an ion implantation step. This will be explained with reference to FIGS. 1A through 2B. Here, FIGS. 1A and 2A show a field oxide isolation region, and FIGS. 1B and 2B show an active region.

FIGS. 1A and 1B show a process of etching a field oxide layer, in which a field oxide layer 33 is partially exposed (the hatched portion of 33) using polysilicon word lines and gates 9 and 11 formed on a semiconductor substrate 29, and masks 41, and then etched. The gates 9 and 11 and the semiconductor substrate 29 in the active region as well as the field oxide layer 33 are partially exposed by the masks 41 for forming a source line, as shown in FIG. 1B. In a state where the gates 9 and 11 and the semiconductor substrate 29 in the active region are exposed, if the field oxide layer 33 is etched, the surfaces of the gates 9 and 11 and the surface of the semiconductor substrate 29 may be partially etched as well. Thus, the thicknesses of the gates may be reduced, which increases the gate resistance. Also, crystalline defects may be generated in the semiconductor substrate, and such defects may degrade the current-voltage characteristics of the device formed therein.

FIGS. 2A and 2B show source ion implantation steps, in which impurity ions are implanted into the semiconductor substrate 29 exposed by the etched field oxide layer 17 and 19. At this time, as shown in FIG. 2B, since parts of the gates 9 and 11 formed on the active region are subjected to the ion implantation process, the gates 9 and 11 may be physically damaged. As a result, electrical damage such as charge accumulation or an increased local electric field may be generated and cause malfunction of the device during operation.

SUMMARY OF THE INVENTION

It is therefore an object of the present invention to provide improved methods of forming integrated circuit memory devices and devices formed thereby.

It is another object of the present invention to provide methods of forming integrated circuit memory devices which include self-alignment techniques to increase integration density and devices formed thereby.

It is still another object of the present invention to provide methods of forming integrated circuit memory devices which includes steps to inhibit implantation and etching damage to gate electrodes and related structures therein and devices formed thereby.

These and other objects, features and advantages of the present invention are provided by methods of forming integrated circuit memory devices which include the steps of forming protection layers on gate electrodes, word lines and related structures and then using these protected structures as etching and implantation masks to reliably form semiconductor regions in a substrate. In particular, methods of forming integrated circuit memory devices preferably include the steps of patterning a field oxide isolation region at a face of a semiconductor substrate to define an active region therein (at openings in the field oxide isolation region) and then forming a gate electrode of a memory device on the active region. Typical memory devices including nonvolatile memory devices such as EEPROM memory devices having floating and control gate electrodes. Word lines (which may comprise a plurality of commonly connected control gate electrodes) are also formed on the gate electrode (e.g., floating gate electrode) and on the field oxide isolation region. A first protection layer comprising a material which can preferably be used as a selective etching mask, is also formed on an upper surface of the word line. The field oxide isolation region, which may be a relatively thick silicon dioxide layer, is then preferably etched to expose the face of the substrate. Here, according to preferred aspect of the present invention, a photoresist pattern may be formed as an array so that additional portions of the field oxide isolation region in the vicinity of drain regions of memory devices in the active portion of the substrate, may be etched as well so that subsequent implantation steps can be performed to increase the size of the drain regions beyond their originally defined size when common source regions are being formed.

The step of etching the field oxide isolation region is preferably performed using the protected word line as an etching mask. Next, dopants of opposite conductivity type to that of the substrate (or a well region therein) are implanted into the exposed face of the substrate to define a common source region therein which is electrically connected to source regions of the memory devices. Here, the step of implanting dopants is performed using the protected word line as an implant mask so that the common source region is self-aligned thereto. Thus, the protection layer is used as an etching mask and an implantation mask so that the word line is not damaged during processing, even if a relatively long duration etching step is performed to etch through a relatively thick field oxide isolation region. According to another preferred aspect of the present invention, the protection layer is formed of a material, such as silicon nitride ($Si_3N_4$) and silicon oxynitride (SiON) which provides high etching selectivity relative to silicon dioxide using conventional etchants.

According to an embodiment of the present invention, the steps of forming a gate electrode, a word line and a first protection layer include the steps of forming a first gate insulating layer (e.g., silicon dioxide) on the face of the substrate and then forming a first conductive layer (e.g., polysilicon) on the first gate insulating layer. A second gate insulating layer is then formed on the first conductive layer. The second gate insulating layer preferably comprises a composite of two silicon dioxide layers and a silicon nitride layer therebetween to form an oxide-nitride-oxide (ONO) composite layer. A second conductive layer (e.g., metal, polysilicon, polycide) is also formed on the second gate insulating layer and then a third gate insulating layer is formed on the second conductive layer. The third gate insulating layer preferably comprises a material selected from the group consisting of silicon nitride and silicon oxynitride. A patterning step is then performed by etching though the gate insulating layer and conductive layers to expose the face of the substrate and define a floating gate electrode, a word line on the floating gate electrode and a first protection layer on the word line. Semiconductor regions of opposite conductivity type to that of the substrate (or well region therein) may then be formed in the active region by performing an implantation step using the patterned layers (and first protection layer) as an implant mask. A high temperature annealing step is also performed to drive-in the implanted dopants and anneal out etching and implantation damage in the substrate. During this high temperature annealing step, birds beak oxide extensions are also preferably formed at bottom edges of the floating gate electrode.

BRIEF DESCRIPTION OF THE DRAWINGS

FIGS. 4A–4B are cross-sectional views of the memory device of FIG. 3, taken along lines 4a–4a' and 4b–4b', respectively.

FIGS. 5A–10A and 5B–10B are cross-sectional views of intermediate structures which illustrate a method of forming the memory device of FIG. 3, according to a first embodiment of the present invention.

FIGS. 12A–12D are cross-sectional views of the memory device of FIG. 11, taken along lines 4a–4a', 4b–4b', 4c–4c' and 4d–4d', respectively.

FIGS. 13A–18A and 13B–18B are cross-sectional views of intermediate structures which illustrate a method of forming the memory device of FIG. 11, according to a second embodiment of the present invention.

DESCRIPTION OF PREFERRED EMBODIMENTS

Figure 1A:
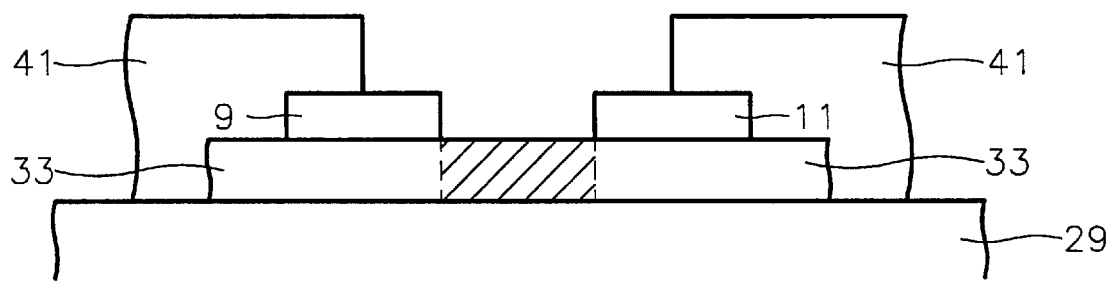
FIGS. 1A–2B are cross-sectional views of intermediate structures which illustrate steps performed in a method of forming a nonvolatile integrated circuit memory device as disclosed in U.S. Pat. No. 5,120,671.
Figure 1B:
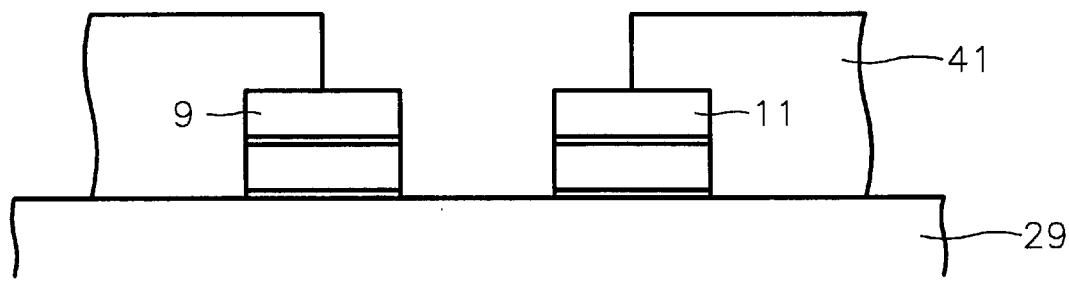
Figure 2A:
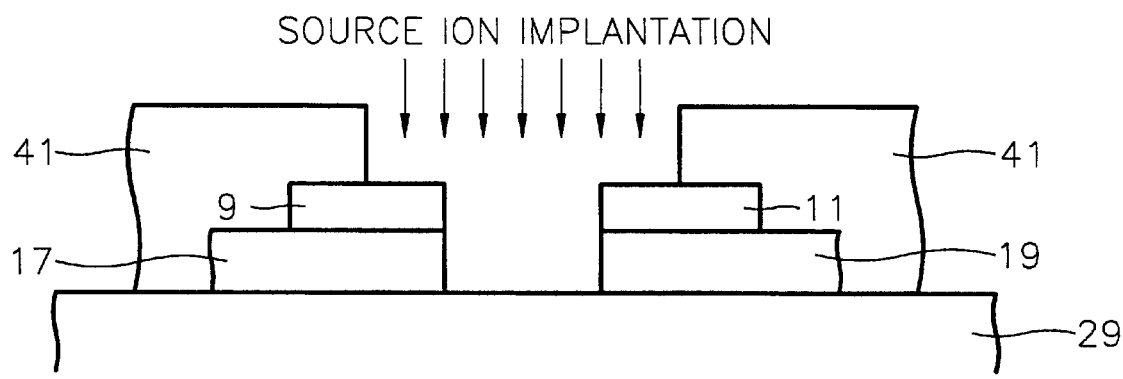
Figure 2B:
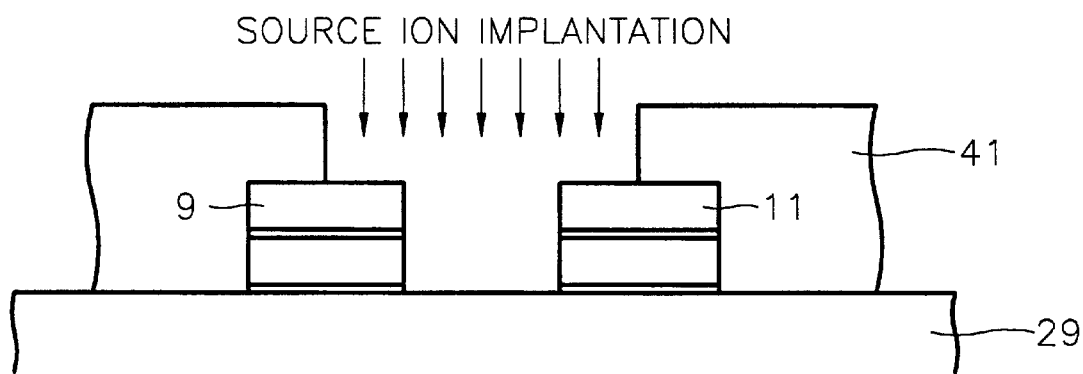

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Moreover, the terms "first conductivity type" and "second conductivity type" refer to opposite conductivity types such as N-type and P-type or vice versa. Like numbers refer to like elements throughout.

Figure 3:
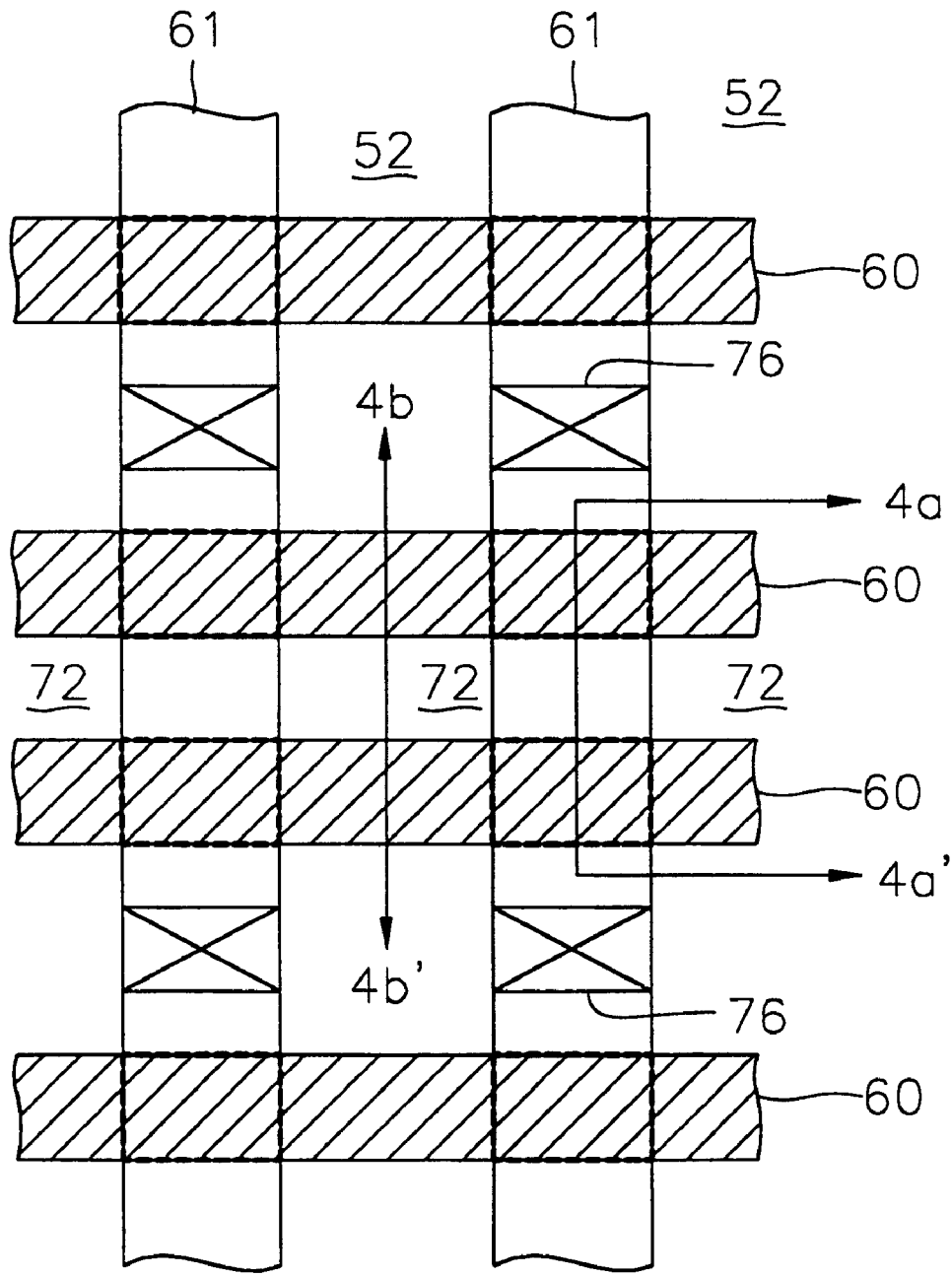
FIG. 3 is layout schematic view of a nonvolatile memory device according to a first embodiment of the present invention.

Referring now to FIG. 3, a layout schematic view of a nonvolatile memory device according to a first embodiment of the present invention will be described. In particular, in FIG. 3 reference numeral 52 denotes the location of a field oxide isolation region having openings therein which define the locations of active regions in a semiconductor substrate in which nonvolatile memory devices (e.g., EEPROM cells) are formed and reference numeral 60 denotes a plurality of word lines. Each word line interconnects the control gates of a row of memory devices together. In addition, reference numeral 61 denotes a plurality of active regions in the substrate which are defined at the openings in the field oxide isolation region 52, reference numeral 72 denotes the location of a common source line of first conductivity type (e.g., N-type) in the substrate and reference numeral 76 denotes the location of a plurality of drain contacts. Moreover, in FIGS. 4A–4B, which are cross-sectional views of the memory device of FIG. 3 taken along lines 4a–4a' and 4b–4b', respectively, reference numeral 50 denotes a semiconductor substrate of second conductivity type (e.g., P-type), reference numeral 54 denotes a first gate insulating layer, reference numeral 56 denotes a floating gate electrode, reference numeral 58 denotes a second gate insulating layer (which preferably comprises a composite of first and second silicon dioxide insulating layers and a silicon nitride layer therebetween), reference numeral 62 denotes a cell gate of an EEPROM memory cell, reference numeral 64 denotes a first protection layer (which preferably comprises a material selected from the group consisting of silicon nitride and silicon oxynitride), reference numeral 65 denotes a thin thermal oxide layer, reference numeral 66 denotes a first impurity region of first conductivity type, reference numeral 67 denotes a birds beak oxide extension and reference numeral 68 denotes an insulating spacer (e.g., silicon nitride, silicon oxynitride).

Thus, the first protection layer 64 is formed over the cell gate 62 in an active portion of the substrate 50 and over the word line 60 on the field oxide isolation region 52. Insulating spacers 68 are formed on the sidewalls of the cell gate 62 and on sidewalls of the word line 60 on the field oxide isolation region 52. As described more fully hereinbelow, the first protection layer 64 and the insulating spacers 68 act as etching and implantation protection layers. The first protection layer 64 and the insulating spacers 68 are preferably formed of a material having a large etching selectivity relative to silicon dioxide, such as a nitride material including silicon nitride ($Si_3N_4$) and silicon oxynitride (SiON). Because the first gate insulating layer 54 and the cell gate 62 are surrounded by the first protection layer 64 and the insulating spacers 68, the cell gate 62 and the word line 60 are not exposed or damaged during the steps of forming a common source region 72 which include etching and ion implantation steps. Moreover, because the present invention includes the formation of birds beak oxide extensions 67 adjacent the bottom corners of the floating gate electrode 56, fewer hot carriers are generated during operation of the memory device.

Figure 5A:
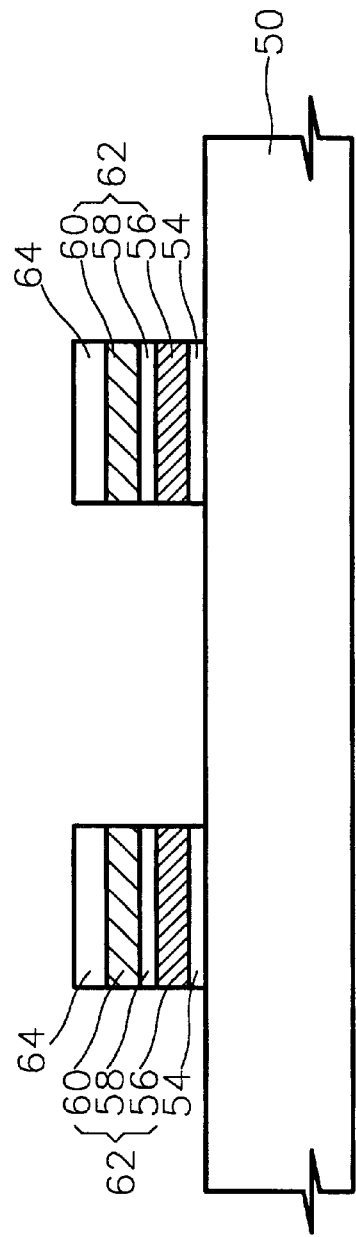

Referring now to FIGS. 5A–10A and 5B–10B, methods of forming the memory device of FIG. 3, according to a first embodiment of the present invention, will be described. In particular, a relatively thick field oxide isolation region 52 is preferably formed at a face of a semiconductor substrate 50 using a conventional technique such as LOCal Oxidation of Silicon (LOCOS). As will be understood by those skilled in the art, a removable mask can be formed on the face of the substrate so that the LOCOS technique can be used to produce a field oxide isolation region 52 having openings therein which define active regions 61 in the substrate. As best illustrated by FIG. 5A, steps are then performed to form a relatively thin first gate insulating layer 54 (e.g., silicon dioxide) on the active regions 61 and then form a first conductive layer 56 (e.g., polysilicon) on the first gate insulating layer 54. Although not shown, an ion implantation step may be performed as a threshold voltage adjustment step before the step of forming the first gate insulating layer 54. A second gate insulating layer 58 is also formed on the first conductive layer 56. The second gate insulating layer 58 preferably comprises a composite of three layers including a first silicon dioxide layer, a first silicon nitride layer and a second silicon dioxide layer stacked vertically as an oxide-nitride-oxide (ONO) stack. A step may also be performed to photolithographically pattern the second gate insulating layer 58 and the first conductive layer 56, to define a floating gate electrode, although this patterning step may be delayed.

Figure 5B:
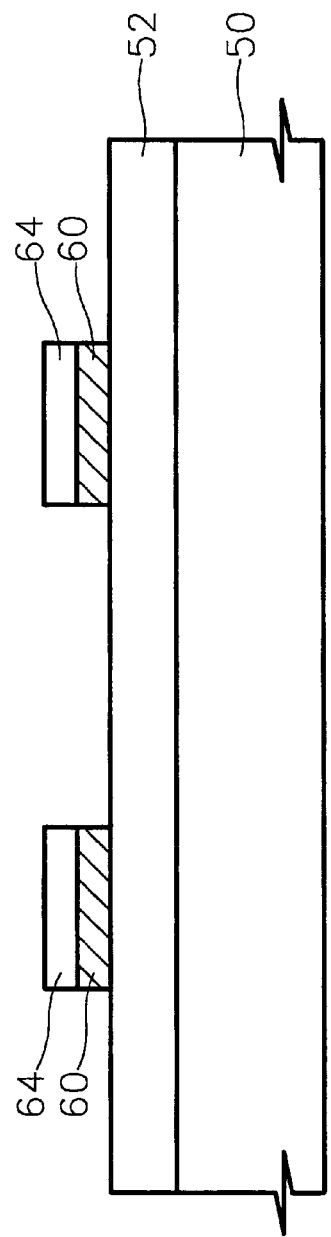

A second conductive layer 60 may then be formed on the second gate insulating layer 58 and on an upper surface of the field oxide isolation region 52, as illustrated by FIGS. 5A and 5B. The second conductive layer 60 may be patterned as a plurality of spaced word lines 60. As will be understood by those skilled in the art, each word line 60 also acts as the control gates of a row of EEPROM memory cells. A third gate insulating layer 64 may also be formed and patterned on the word lines 60 as a first protection layer. Here, the first protection layer 64 may comprise silicon nitride or silicon oxynitride, for example, which can be selectively etched at a much slower rate relative to silicon dioxide using conventional etchants. As described more fully hereinbelow, the first protection layer 64 is preferably formed to prevent the resistance of the word lines 60 from increasing during a subsequent step of patterning the field oxide isolation region and to prevent the cell gate 62 from being damaged during a subsequent ion implantation step(s) for forming source and drain regions in the substrate 50.

Referring now to FIGS. 6A and 6B, a step is then performed to initiate formation of source and drain regions of first conductivity type in the substrate 50 (or well region (not shown) therein) by implanting dopants 69 of first conductivity type into the active regions 61, using the first protection layer 64 and the field oxide isolation region 52 as an implant mask. Moreover, because the first protection layer is defined to cover a peripheral circuit portion of the substrate 50 (i.e., outside the memory cell array region), the dopants 69 can be blocked from being implanted into the peripheral circuit region. Referring now to FIGS. 7A and 7B, the substrate 50 is then thermally treated in an oxidizing environment at a temperature greater than about 900° C., and preferably at a temperature in a range between 900° C. and 1,000° C., to drive-in the implanted dopants of first conductivity type into the active region 61 and underneath the cell gate 62, form a relatively thin thermal oxide layer 65 on the face of the substrate 50 and also form birds beak oxide extensions 67 having a thickness in a range between about 200 Å and 1,000 Å at the bottom corners of the floating gate electrodes 56. Here, because the source and drain regions 66 are extended laterally underneath the cell gate 62 by the thermal treatment, the effective channel length of the EEPROM memory cell is reduced and the rate of injection of electrons into the floating gate during programming is increased. The birds beak extensions 67 also prevent the generation of hot carriers at the edges of the gate oxide layer 54 due to concentrated electric fields and cure damage which may occur at the edges of the first gate insulating layer 54 during the steps of forming the cell gate 62.

As illustrated best by FIGS. 8A–8B, a step is then performed to define insulating spacers 68 on sidewalls of the cell gates 62 and word lines 60 by depositing a layer of electrically insulating material selected from the group consisting of silicon nitride ($Si_3N_4$) and silicon oxynitride (SiON), on the cells gates 62, the thin thermal oxide layer 65 and the field oxide isolation region 52, and then anisotropically etching the deposited layer to define insulating spacers 68 on the sidewalls of the cell gates 62. Referring now to FIGS. 9A and 9B, the steps associated with patterning the field oxide isolation region 52 will be described. In particular, a layer of photoresist material 70 is patterned on the substrate, to expose a portion of the field oxide isolation region 52 extending between adjacent word lines 60. During this step of patterning the layer of photoresist material 70, the first protection layer 64 and the insulating spacers 68 may also be exposed. An etching step is then performed to remove a portion ($f_1$) of the field oxide isolation region 52, using the patterned layer of photoresist material 70, the first protection layer 64 and the insulating spacers 68 as etching masks. As will be understood by those skilled in the art, by patterning the photoresist material 70 to expose the insulating spacers 68, the portion ($f_1$) of the field oxide isolation region 52 which is to be etched is self-aligned to the insulating spacers 68. The step of etching the field oxide isolation region 52 is preferably performed by performing a plasma dry etching step. Moreover, because the top and sidewalls of the cell gate 62 are covered by the first protection layer 64 and the insulating spacers 68 which etch at a much slower rate relative to silicon dioxide in the plasma dry gas, they are not exposed to electrical or physical damage caused by the dry etching gas.

Furthermore, because the source and drain regions 66 are partially exposed during the step of etching the field oxide isolation region 52, a pitting region ($P_1$) may be formed in the source and drain regions 66. However, because the sidewalls of the cell gate 62 and the edges of the pitting region ($P_1$) are spaced from each other by a distance about equal to the width of the insulating spacers 68, the operational characteristics of the memory cells are stabilized and the reliability of the memory cells may be enhanced compared to prior art methods which result in the formation of pitting regions which are closely spaced to edges of the cell gate 62.

Referring now to FIGS. 10A–10B, a step is then performed to initiate formation of common source regions 72 in the substrate 50 (or well region (not shown) therein) by implanting dopants 79 of first conductivity type into the source and drain regions 66 and into the portions of the substrate 50 which were exposed during the step of etching the field oxide isolation region 52. Accordingly, the resistance of the source and drain regions 66 is reduced and parasitic implantation of dopants into the cell gate 62 (including word line 64) is prevented by the first protection layer 64 and insulating spacers 68. Thereafter, to repair the surface of the substrate 50 receiving the implanted dopants and exposed to etchants, the substrate 50 is then thermally treated at a temperature greater than about 900° C., and preferably at a temperature in a range between 900° C. and 1,000° C., to drive-in the implanted dopants 79. This thermal treatment step may be performed in an oxidizing environment to increase the size of the birds beak oxide extensions 67.

Thus, according to the first embodiment of the present invention, a number of the etching and ion implantation steps are performed while the cell gates 62 of the memory devices are protected, which means that process damage (including increases in resistance) to the cell gates 62 can be reduced.

FIGS. 11 through 16B are views for illustrating a nonvolatile memory device according to a second embodiment of the present invention and manufacturing methods therefor. With the exception of the extended size of the drain regions and the novel steps for extending the size of the drain regions, the second embodiment of the present invention is similar to the above described first embodiment. As described more fully hereinbelow, the size of the drain regions can be extended by forming a photoresist pattern (used during the step of etching the field oxide isolation region) in the shape of a matrix array so that a portion of the isolation region adjoining a drain active region is also exposed.

Figure 11:
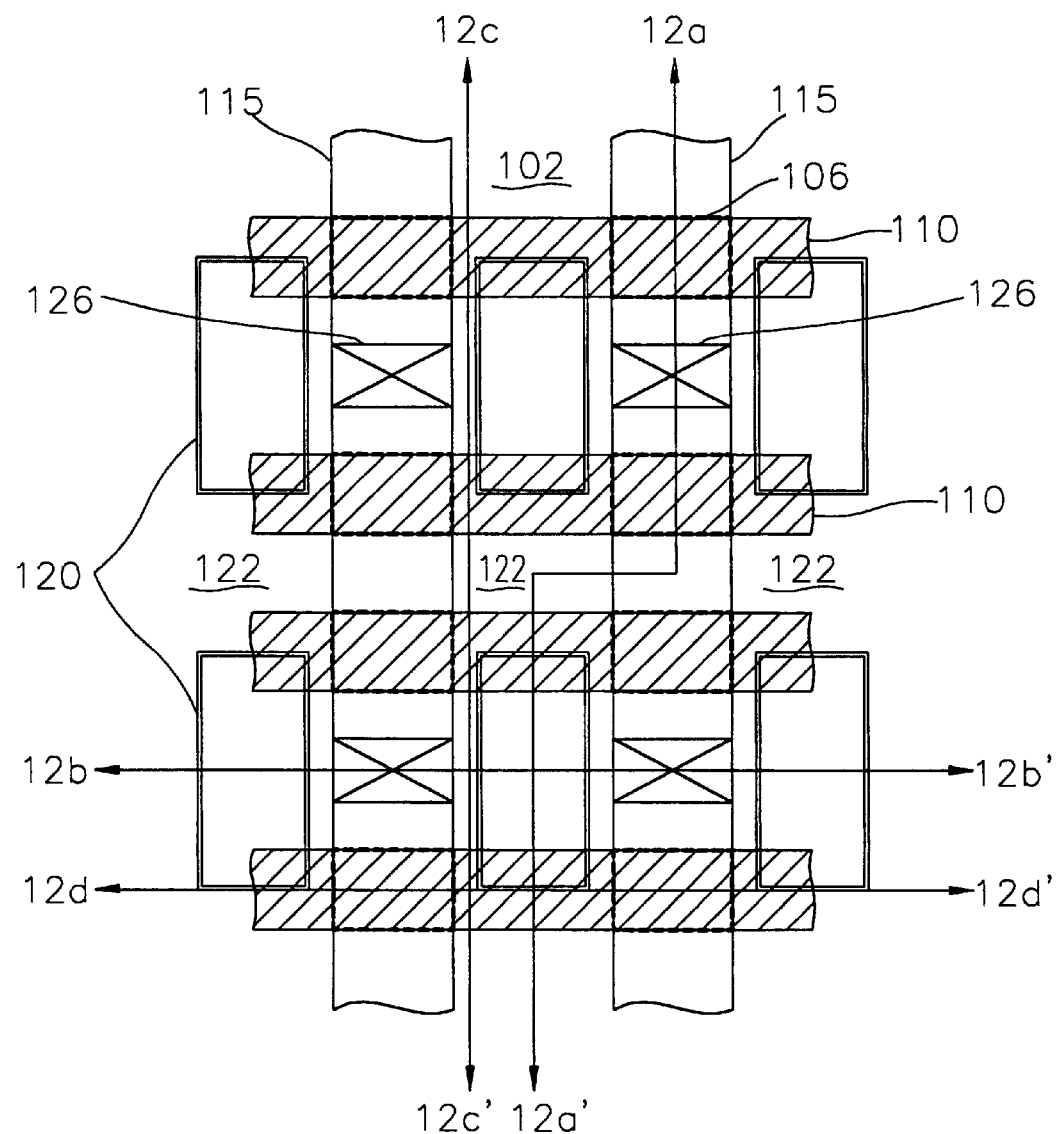
FIG. 11 is layout schematic view of a nonvolatile memory device according to a second embodiment of the present invention.

In particular, FIG. 11 is a layout schematic view of a nonvolatile memory device according to a second embodiment of the present invention and FIGS. 12A–12D are cross-sectional views of the memory device of FIG. 11, taken along lines 4a–4a', 4b–4b', 4c–4c' and 4d–4d', respectively. In addition, FIGS. 13A–18A and 13B–18B are cross-sectional views of intermediate structures which illustrate a method of forming the memory device of FIG. 11, according to a second embodiment of the present invention. In FIGS. 11 through 12D, reference numeral 100 denotes a semiconductor substrate, reference numeral 102 denotes a field oxide layer which is formed on the semiconductor substrate 100, reference numeral 104 denotes a gate oxide layer, reference numeral 106 denotes a floating gate, reference numeral 108 denotes an interlayer insulating layer for insulating the floating gate 106, reference numeral 110 denotes a word line formed lengthwise in one direction, reference numeral 112 denotes a cell gate comprised of the floating gate 106, the interlayer insulating layer 108 and the word line 110 functioning as a control gate, reference numeral 114 denotes an etching protection layer formed on the word line 110 in the same pattern as that of the word line 110, reference numeral 115 denotes an active region formed to traverse the word line 110, reference numeral 116 denotes a first impurity region formed in the active region 115 after forming the cell gate 112, reference numeral 118 denotes spacers formed at the side walls of the cell gate 112 and the word line 110, reference numeral 120 denotes a mask pattern, e.g., a photoresist pattern for forming a self-aligning source/drain, reference numeral 122 denotes a second impurity region formed by implanting an impurity after etching the field oxide layer 102, i.e., a common source region, reference numeral 123 denotes an extended drain region simultaneously formed with common source region 122, reference numeral 124 denotes an insulating layer, and reference numeral 126 denotes a drain contact, respectively.

As illustrated best by FIG. 11, the photoresist pattern 120 is formed in a matrix array in an area except the active region 115 and the common source region 122. Since the matrix-arrayed photoresist pattern 120 is patterned so as to be spaced apart from the active region 115, particularly the drain active region, by a predetermined distance, a device isolation region adjacent to the drain active region as well as a portion where a source region is to be formed is exposed by a predetermined space. Therefore, the common source region 122 is formed by a subsequent impurity implantation process and a drain larger than designed is also advantageously formed. As shown in FIG. 12B, the drain active region is extended by the dimensions "e" corresponding to the removed field oxide layer 102. Next, a method of manufacturing the nonvolatile memory device shown in FIGS. 12A and 12B will be described with reference to FIGS. 13A through 18B.

FIGS. 13A and 13B illustrate the step of forming the cell gate 112 and the word line 110. The field oxide layer 102 is formed in the same manner as shown in FIGS. 5A and 5B, and the gate oxide layer 104 and the cell gate 112 are formed on the active region 115. The word line 110 is also formed on the field oxide layer 102, concurrently with the word line 110 functioning as the control gate of the cell gate 112. The etching protection layer 114 having the same pattern as that of the cell gate 112 and the word line 110 is formed on the cell gate 112 and word line 110. The purpose and method for forming the etching protection layer 114 are the same as described in the first embodiment. An impurity ion implantation for adjusting a threshold voltage may be performed over the entire surface of the semiconductor substrate before forming the gate oxide layer 104. FIGS. 14A and 14B illustrate a primary impurity implantation step. An impurity, e.g., an impurity having a conductivity type opposite to that of the well (not shown) or the substrate 100, are implanted into the entire surface of the resultant structure where the etching protection layer 114 is formed, like in the first embodiment. At this time, since the etching protection layer 114 remains in the peripheral circuit region (not shown), the impurity is prevented from being implanted into the semiconductor substrate in the peripheral circuit region.

Here, a thermal treatment step may be performed after the primary impurity ion implantation step, thereby repairing the semiconductor substrate damaged by the primary impurity ion implantation, repairing the damaged gate oxide layer 104 and forming a gate bird's beak (67 in FIGS. 7A and 7B) at the edges of the cell gate 112 and word line 110. Since the first impurity region 116 is extended laterally under the cell gate 112 by the thermal treatment, the effective channel length is reduced, thereby improving the rate of injection into the floating gate 106. FIGS. 15A and 15B illustrate the step of forming the spacer 118. An insulating material, e.g., an oxide or a nitride, is deposited over the entire surface of the resultant structure where the first impurity region 116 is situated and then anisotropically etched, thereby forming the spacer 118 at the side walls of the cell gate 112 and word line 110.

Like in the first embodiment, together with the etching protection layer 114, the spacer 118 functions to prevent the gate oxide layer 104, the word line 110 and specifically the cell gate 112, from being damaged in a subsequent step of etching the field oxide layer 102 or an ion implantation. FIGS. 16A and 16B illustrate the step of etching the field oxide layer 102. A photoresist layer is deposited over the resultant structure where the spacer 118 is formed and then is patterned. Accordingly, the photoresist pattern 120 is formed in a matrix array by which a portion where a source line is to be formed and a predetermined portion of the device isolation region adjacent to the drain active region are exposed. Subsequently, using the photoresist pattern 120, the word line A 110 and the spacer 118 as an etching mask, a part ($f_2$ and $f_3$) of the field oxide layer 102 is selectively removed. Therefore, the field oxide layer 102 formed at a part ($f_2$ of FIG. 16A) where the common source region is to be formed and a predetermined portion of the field oxide layer 102($f_3$ of FIG. 16B) adjacent to the first impurity region 116 is removed.

At this time, a plasma dry etching process may be adopted as in the first embodiment. Since the top and side walls of the gate oxide layer 104, the cell gate 112 and the word line 110 are covered by the etching protection layer 114 and the spacer 118, they can be protected without being exposed to the plasma dry etching gas. Also, since the surface of the semiconductor substrate 100 is partially exposed to the etching process, a pitting area ($P_2$) may be formed. As described in the first embodiment, according to the present invention, since the cell gate 112 and the pitting area ($P_2$) are spaced apart from each other by a distance equal to the width of the spacer 118, the operational characteristics of the memory cell are stabilized, thereby enhancing the reliability, compared to the conventional art in which the cell gate and the pitting area are closely adjacent to each other.

Figure 17A:
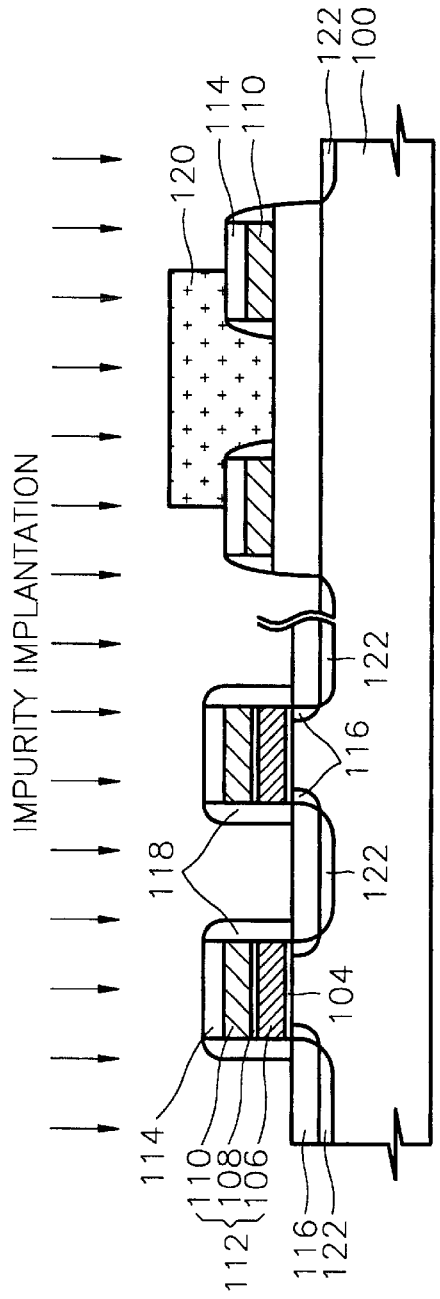
Figure 17B:
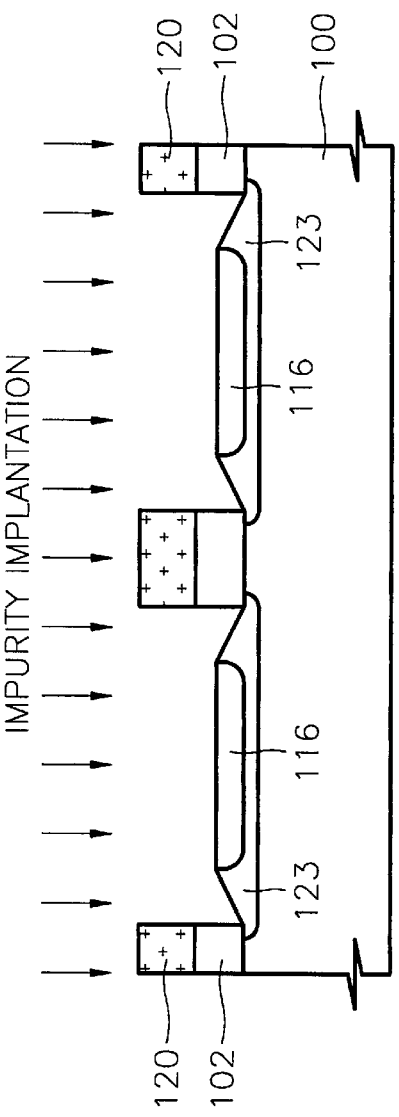

FIGS. 17A and 17B illustrate the secondary impurity implantation step. An impurity having a conductivity type opposite to that of a well (not shown) or the substrate 100, as in the primary ion implantation step, are implanted into the entire surface of the resultant structure where the field oxide layer 102 is partially removed. Therefore, the common source region 122 and the extended drain region 123 are formed. At this time, since an impurity is implanted in a state where a part ($f_3$ of FIG. 16B) of the field oxide layer 102 adjacent to the drain active region is removed, the drain active region is extended, as shown in FIG. 17B. Therefore, a drain active region larger than designed is obtained, which is advantageous for attaining high integration.

FIGS. 18A and 18B illustrate the step of forming the drain contact 126. An insulating material, e.g., an oxide, is deposited over the resultant structure where the common source region 122 and the extended drain region 123 are formed, to form the insulating layer 124. Then, the insulating layer 124 is patterned in a conventional manner to form the drain contact 126 exposing parts of the drain regions 116 and 123.

As described above, the nonvolatile memory device and the manufacturing method therefor according to the present invention have the following advantages. First, the top and sidewalls of a gate oxide layer, a word line and a memory cell gate are protected by an etching protection layer (64 or 114) and spacers (68 or 118). Therefore, the gate oxide layer, the word line and the cell gate are not exposed during a field oxide layer etching process for forming a source line or an ion implantation process for forming an impurity region and are not damaged. Therefore, the increase in resistance of the cell gate, particularly a word line functioning as a control gate, is suppressed and the reliability of the device is improved. Second, since the cell gate (62 or 112) and a pitting area ($P_1$ or $P_2$) are spaced apart from each other by a distance equal to the width of the spacer (68 or 118), the operational characteristics of the memory cell can be stabilized, compared to the conventional art by which a gate and a pitting area are closely adjacent to each other. Third, since an impurity is implanted in a state where a part ($f_3$ of FIG. 16B) of a field oxide layer 102 adjacent to the drain active region is removed, the drain active region is extended. Therefore, a drain active region larger than designed is obtained, which is advantageous for attaining high integration. Fourth, since an etching protection layer (64 or 114) serves as an ion implantation mask in forming a source/drain active region (66 or 116), a photolithography process for ion implantation is not necessary.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit memory device, comprising the steps of:

patterning a field oxide isolation region at a face of a semiconductor substrate to define an active region therein;

forming a gate electrode of a memory device on the active region;

forming a word line on the field oxide isolation region and on the gate electrode;

forming a first protection layer on an upper surface of the word line;

implanting source and drain region dopants of first conductivity type into the active region, using the first protection layer as an implant mask; then etching the field oxide isolation region to expose the face of the substrate, using the first protection layer as an etching mask; and implanting dopants of first conductivity type into the exposed face of the substrate to define a common source region therein which is electrically coupled to the memory device, using the first protection layer as an implant mask.

2. The method of claim 1, wherein said step of etching the field oxide isolation region is preceded by the step of forming a second protection layer on sidewalls of the word line.

3. The method of claim 2, wherein said steps of forming a gate electrode, a word line and a first protection layer comprise the steps of:

forming a first gate insulating layer on the face of the substrate, opposite the active region;

forming a first conductive layer on the first gate insulating layer, opposite the active region;

forming a second gate insulating layer on the first conductive layer, opposite the first gate insulating layer;

forming a second conductive layer on the second gate insulating layer, opposite the first conductive layer;

forming a third gate insulating layer on the second conductive layer, opposite the second gate insulating layer;

patterning the third gate insulating layer as the first protection layer and the second conductive layer as the word line; and patterning the first conductive layer to define a floating gate electrode.

4. The method of claim 3, wherein the second gate insulating layer comprises first and second oxide insulating layers and a nitride insulating layer therebetween.

5. The method of claim 4, wherein the third gate insulating layer comprises a material selected from the group consisting of silicon nitride and silicon oxynitride.

6. The method of claim 5, wherein said step of etching the field oxide isolation region is preceded by the step of thermally treating the substrate at a temperature greater than about 900° C. to drive-in the implanted source and drain region dopants of first conductivity type into the active region and form a birds beak oxide extension having a thickness in a range between about 200 and 1,000 Å, between the floating gate electrode and the face.

7. The method of claim 6, wherein said step of forming a second protection layer on sidewalls of the word line comprises depositing a layer of material selected from the group consisting of silicon nitride and silicon oxynitride, on the substrate; and then anisotropically etching the deposited layer of material to define insulating spacers on sidewalls of the floating gate electrode and the word line.

8. The method of claim 7, wherein said step of etching the field oxide isolation region comprises etching the field oxide isolation region using a plasma and the first protection layer and insulating spacers as an etching mask; and wherein said step of implanting dopants of first conductivity type into the exposed face of the substrate to define a common source region is followed by the step of thermally treating the substrate at a temperature greater than about 900° C. to repair etching damage in the substrate.

9. A method of forming nonvolatile memory device, comprising the steps of:
- patterning a field oxide isolation region at a face of a semiconductor substrate to define an active region therein;
- forming first and second floating gate electrodes of respective first and second EEPROM memory cells, on the active region;
- forming a word line on the field oxide isolation region and on the first and second floating gate electrodes;
- forming a first protection layer on an upper surface of the word line;
- implanting source and drain region dopants of first conductivity type into the active region, using the first protection layer as an implant mask; then
- etching the field oxide isolation region to expose the face of the substrate, using the first protection layer as an etching mask; and
- implanting dopants of first conductivity type into the exposed face of the substrate to define a common source region therein which is electrically coupled to the first and second EEPROM memory cells, using the first protection layer as an implant mask.

10. The method of claim 9, wherein said step of etching the field oxide isolation region is preceded by the step of forming a second protection layer on sidewalls of the word line.

11. The method of claim 10, wherein said steps of forming a first floating gate electrode, a word line and a first protection layer comprise the steps of:
- forming a first gate insulating layer on the face of the substrate, opposite the active region;
- forming a first conductive layer on the first gate insulating layer, opposite the active region;
- forming a second gate insulating layer on the first conductive layer, opposite the first gate insulating layer;
- forming a second conductive layer on the second gate insulating layer, opposite the first conductive layer;
- forming a third gate insulating layer on the second conductive layer, opposite the second gate insulating layer;
- patterning the third gate insulating layer as the first protection layer and the second conductive layer as the word line; and
- patterning the first conductive layer as the first floating gate electrode.

12. The method of claim 11, wherein the second gate insulating layer comprises first and second oxide insulating layers and a nitride insulating layer therebetween.

13. The method of claim 12, wherein the third gate insulating layer comprises a material selected from the group consisting of silicon nitride and silicon oxynitride.

14. The method of claim 13, wherein said step of etching the field oxide isolation region is preceded by the step of thermally treating the substrate at a temperature greater than about 900° C. to drive-in the implanted source and drain region dopants of first conductivity type into the active region and form a birds beak oxide extension having a thickness in a range between about 200 and 1,000 Å, between the first floating gate electrode and the face.

15. The method of claim 14, wherein said step of forming a second protection layer on sidewalls of the word line comprises depositing a layer of material selected from the group consisting of silicon nitride and silicon oxynitride, on the substrate; and then anisotropically etching the deposited layer of material to define insulating spacers on sidewalls of the first floating gate electrode and the word line.

16. The method of claim 15, wherein said step of etching the field oxide isolation region comprises etching the field oxide isolation region using a plasma and the first protection layer and insulating spacers as an etching mask; and wherein said step of implanting dopants of first conductivity type into the exposed face of the substrate to define a common source region is followed by the step of thermally treating the substrate at a temperature greater than about 900° C. to repair etching damage in the substrate.

17. A method of forming an integrated circuit memory device, comprising the steps of:
- forming a field oxide isolation region at a face of a semiconductor substrate to define an active region therein;
- forming a gate electrode of a memory device on the active region;
- forming a word line on the field oxide isolation region and on the gate electrode;
- forming a first protection layer comprising a material selected from the group consisting of silicon nitride and silicon oxynitride, on an upper surface of the word line;
- etching the field oxide isolation region to expose the face of the substrate, using the first protection layer as an etching mask that protects the word line; and
- implanting dopants of first conductivity type into the exposed face of the substrate to define a common source region therein which is electrically coupled to the memory device, using the first protection layer as an implant mask that protects the word line from implant damage.

18. The method of claim 17, wherein said step of etching the field oxide isolation region is preceded by the step of forming a second protection layer on sidewalls of the word line.

19. The method of claim 18, wherein said steps of forming a gate electrode, a word line and a first protection layer comprise the steps of:
- forming a first gate insulating layer on the face of the substrate, opposite the active region;
- forming a first conductive layer on the first gate insulating layer, opposite the active region;
- forming a second gate insulating layer on the first conductive layer, opposite the first gate insulating layer;
- forming a second conductive layer on the second gate insulating layer, opposite the first conductive layer;
- forming a third gate insulating layer on the second conductive layer, opposite the second gate insulating layer;
- patterning the third gate insulating layer as the first protection layer, patterning the second conductive layer as the word line and patterning the second gate insulating layer; and
- patterning the first conductive layer to define a floating gate electrode.

20. The method of claim 19, wherein the second gate insulating layer comprises first and second oxide insulating layers and a nitride insulating layer therebetween.

21. The method of claim 20, wherein said step of etching the field oxide isolation region is preceded by the steps of implanting dopants of first conductivity type into the active region, using the patterned third gate insulating layer as an implant mask; and then thermally treating the substrate at a temperature greater than about 900° C. to drive-in the implanted dopants of first conductivity type into the active region and form a birds beak oxide extension having a thickness in a range between about 200 and 1,000 Å, between the floating gate electrode and the face.

22. The method of claim 21, wherein said step of forming a second protection layer on sidewalls of the word line comprises depositing a layer of material selected from the group consisting of silicon nitride and silicon oxynitride, on the substrate; and then anisotropically etching the deposited layer of material to define insulating spacers on sidewalls of the floating gate electrode and the word line.

23. The method of claim 22, wherein said step of etching the field oxide isolation region comprises etching the field oxide isolation region using a plasma and the first protection layer and insulating spacers as an etching mask; and wherein said step of implanting dopants of first conductivity type into the exposed face of the substrate to define a common source region is followed by the step of thermally treating the substrate at a temperature greater than about 900° C. to repair etching damage in the substrate.

24. A method of forming nonvolatile memory device, comprising the steps of:

forming a field oxide isolation region at a face of a semiconductor substrate to define an active region therein;

forming first and second floating gate electrodes of respective first and second EEPROM memory cells, on the active region;

forming a word line on the field oxide isolation region and on the first and second floating gate electrodes;

forming a first protection layer comprising a material selected from the group consisting of silicon nitride and silicon oxynitride, on an upper surface of the word line;

etching the field oxide isolation region to expose the face of the substrate, using the first protection layer as an etching mask that protects the word line; and implanting dopants of first conductivity type into the exposed face of the substrate to define a common source region therein which is electrically coupled to the first and second EEPROM memory cells, using the first protection layer as an implant mask that protects the word line from implant damage.

25. The method of claim 24, wherein said step of etching the field oxide isolation region is preceded by the step of forming a second protection layer on sidewalls of the word line.

26. The method of claim 25, wherein said steps of forming a first floating gate electrode, a word line and a first protection layer comprise the steps of:

forming a first gate insulating layer on the face of the substrate, opposite the active region;

forming a first conductive layer on the first gate insulating layer, opposite the active region;

forming a second gate insulating layer on the first conductive layer, opposite the first gate insulating layer;

forming a second conductive layer on the second gate insulating layer, opposite the first conductive layer;

forming a third gate insulating layer on the second conductive layer, opposite the second gate insulating layer;

patterning the third gate insulating layer as the first protection layer, patterning the second conductive layer as the word line and patterning the second gate insulating layer; and patterning the first conductive layer as the first floating gate electrode.

27. The method of claim 26, wherein the second gate insulating layer comprises first and second oxide insulating layers and a nitride insulating layer therebetween.

28. The method of claim 27, wherein said step of etching the field oxide isolation region is preceded by the steps of implanting dopants of first conductivity type into the active region, using the first protection layer as an implant mask; and then thermally treating the substrate at a temperature greater than about 900° C. to drive-in the implanted dopants of first conductivity type into the active region and form a birds beak oxide extension having a thickness in a range between about 200 and 1,000 Å, between the first floating gate electrode and the face.

29. The method of claim 28, wherein said step of forming a second protection layer on sidewalls of the word line comprises depositing a layer of material selected from the group consisting of silicon nitride and silicon oxynitride, on the substrate; and then anisotropically etching the deposited layer of material to define insulating spacers on sidewalls of the first floating gate electrode and the word line.

30. The method of claim 29, wherein said step of etching the field oxide isolation region comprises etching the field oxide isolation region using a plasma and the first protection layer and insulating spacers as an etching mask; and wherein said step of implanting dopants of first conductivity type into the exposed face of the substrate to define a common source region is followed by the step of thermally treating the substrate at a temperature greater than about 900° C. to repair etching damage in the substrate.

* * * * *